United States Patent
Sarrach et al.

(10) Patent No.: US 12,474,613 B2
(45) Date of Patent: Nov. 18, 2025

(54) INSULATED GLAZING UNIT HAVING AN ELECTRICALLY CONDUCTIVE COATING AND/OR AN ELECTRICALLY CONTROLLABLE FUNCTIONAL ELEMENT

(71) Applicant: SAINT-GOBAIN GLASS FRANCE, Courbevoie (FR)

(72) Inventors: Sebastian Marius Sarrach, Munich (DE); Ariane Weissler, Aachen (DE); Michael Hirsch, Aachen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 444 days.

(21) Appl. No.: 18/042,392

(22) PCT Filed: Sep. 1, 2021

(86) PCT No.: PCT/EP2021/074108
§ 371 (c)(1),
(2) Date: Feb. 21, 2023

(87) PCT Pub. No.: WO2022/063535
PCT Pub. Date: Mar. 31, 2022

(65) Prior Publication Data
US 2023/0333433 A1    Oct. 19, 2023

(30) Foreign Application Priority Data
Sep. 24, 2020    (EP) .................................... 20197977

(51) Int. Cl.
*G02F 1/153* (2006.01)
*C09J 7/29* (2018.01)
(Continued)

(52) U.S. Cl.
CPC .............. *G02F 1/1533* (2013.01); *C09J 7/29* (2018.01); *C09J 9/02* (2013.01); *E06B 3/6722* (2013.01);
(Continued)

(58) Field of Classification Search
CPC ........... G02F 1/1533; G02F 1/15; G02F 1/155
See application file for complete search history.

(56) References Cited

U.S. PATENT DOCUMENTS

| 2014/0133005 A1 | 5/2014 | Sbar et al. |
| 2019/0041680 A1 | 2/2019 | Yoshida et al. |

(Continued)

FOREIGN PATENT DOCUMENTS

| WO | WO 2019/055306 A1 | 3/2019 |
| WO | WO 2020/173785 A1 | 9/2020 |

OTHER PUBLICATIONS

International Search Report as issued in International Patent Application No. PCT/EP2021/074108, dated Dec. 2, 2021.

*Primary Examiner* — Joseph P Martinez
(74) *Attorney, Agent, or Firm* — Pillsbury Winthrop Shaw Pittman LLP

(57) ABSTRACT

An insulating glazing unit includes two panes and a spacer, with two pane contact surfaces. A first and second pane contact surfaces are connected to, respectively, a first and a second pane via a sealant to form a glazing interior space and a glazing exterior space. At least one pane is provided on the side facing the glazing interior space at least partially with an electrically conductive coating and/or an electrically controllable functional element and two bus bars are provided for electrically contacting the electrically conductive coating and/or the electrically controllable functional element. A bus bar includes an electrically conductive adhesive tape. The electrically conductive adhesive tape includes an electrically conductive adhesion layer, a conductor track, (Continued)

Figure 1:
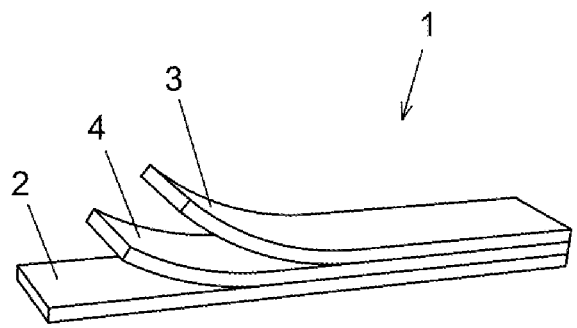

and an opaque, electrically insulating cover. The electrically conductive adhesive tape is connected via the electrically conductive adhesion layer to the electrically conductive coating and/or to the electrically controllable functional element.

18 Claims, 9 Drawing Sheets

(51) Int. Cl.
    *C09J 9/02*     (2006.01)
    *E06B 3/67*     (2006.01)
    *E06B 9/24*     (2006.01)
    *H01B 1/22*     (2006.01)
    *E06B 3/663*     (2006.01)

(52) U.S. Cl.
    CPC ............... *E06B 9/24* (2013.01); *H01B 1/22* (2013.01); *C09J 2203/326* (2013.01); *C09J 2467/006* (2013.01); *E06B 3/66352* (2013.01); *E06B 2009/2464* (2013.01); *G02F 2202/16* (2013.01); *G02F 2202/28* (2013.01)

(56) References Cited

U.S. PATENT DOCUMENTS

2019/0094643 A1    3/2019    Friedman et al.
2021/0246714 A1*    8/2021    Neander ............ E06B 3/66366

* cited by examiner

INSULATED GLAZING UNIT HAVING AN ELECTRICALLY CONDUCTIVE COATING AND/OR AN ELECTRICALLY CONTROLLABLE FUNCTIONAL ELEMENT

CROSS-REFERENCE TO RELATED APPLICATIONS

This application is the U.S. National Stage of PCT/EP2021/074108, filed Sep. 1, 2021, which in turn claims priority to European patent application number 20197977.0 filed Sep. 24, 2020. The content of these applications are incorporated herein by reference in their entireties.

The invention relates to an insulating glazing unit including an electrically conductive coating and/or an electrically controllable functional element.

Insulating glazing units are increasingly frequently installed in glass façades for aesthetic reasons, in particular when the façade is optically implemented as an all-glass façade. Such an insulating glazing unit is made of at least two panes that are held at a distance from one another by a spacer. The panes can have a thermal protection coating and/or a solar protection coating. Such coatings can also be silver-containing and thus enable low transmittance of infrared radiation. This can lower the temperature in the interior of the building. In addition to the important property of thermal insulation, functional as well as optical and aesthetic features also increasingly play an important role in the field of building glazing.

In recent years, glazings with electrochromic properties or those with electrically controllable liquid crystal layers for controlling light transmittance have been used increasingly. An insulating glazing unit with an electrochromic coating requires an electrical connection and bus bars. One problem that is, for example, associated with the bus bars present in insulating glazing units consists in that the bus bars are generally situated in the glazing interior space and are visible both from the outside and the inside, which reduces the visible area of the window and, moreover, is aesthetically unsightly.

An opaque coating that is usually applied to a pane by screen printing or an opaque component that is attached on a pane to thus conceal the bus bars are known. The aesthetic benefit is quite limited since relatively large regions of the pane have to be provided with the opaque coating or component in order to achieve suitable covering of the bus bars when viewed from the outside, excessively limiting the visible area of the insulating glazing. Moreover, for production engineering reasons, the opaque coating or component and the spacer used have different colors, which is likewise undesirable for aesthetic reasons when viewed from the inside. Nowadays, the bus bars in the insulating glazing unit are concealed only from the outside. However, when viewed from the interior-side of a space, the bus bars and the solder pad are visible, which is likewise detrimental to the aesthetics.

A bus bar is, for example, strip-shaped or wire-shaped. The bus bar is made of an electrically conductive material, such as silver or copper. It can be produced, for example, by printing a conductive silver paste on the electrically conductive and/or electrically switchable coating for electrical contacting. The baked conductive silver paste contains silver particles. If the silver paste is baked, damage, such as a short-circuit between the surface electrodes of the electrochromic coating should be avoided.

WO 2020/173785 A1 discloses a glazing unit that has two glass panes connected to one another at a predefined distance via a spacer profile. One of the glass panes has, on the inside of the glazing unit, an electrically conductive coating and a bus bar for electrically connecting the conductive coating. The bus bar is provided with an opaque cover.

US 2014/133005 A1 discloses an electrochromic device with at least one bus bar and a color-obscuration material, wherein the bus bar is coated with a coating material that is essentially non-porous and is color matched to the color-obscuration material, a spacer, or a polymer seal.

The object of the invention is, consequently, to specify an insulating glazing unit that is improved both aesthetically and, in particular, functionally that can be implemented simply and economically.

The object of the present invention is accomplished according to the invention by an insulating glazing unit in accordance with claim 1. Preferred embodiments are apparent from the dependent claims.

The insulating glazing unit according to the invention comprises at least two panes and at least one spacer that has two pane contact surfaces that extend parallel to one another. A first pane contact surface is connected via a sealant to a first pane of the two panes, and a second pane contact surface is connected via a sealant to the second pane such that a glazing interior space and a glazing exterior space are formed. One of the two panes is provided, on the side facing the glazing interior space, at least partially with an electrically conductive coating and/or an electrically controllable functional element. Two bus bars are provided for electrically contacting the electrically conductive coating and/or the electrically controllable functional element. At least one bus bar comprises an electrically conductive adhesive tape, wherein the electrically conductive adhesive tape comprises an electrically conductive adhesion layer, a conductor track, and an opaque, electrically insulating cover. The bus bars are preferably strip-shaped.

Opacity generally refers to the opposite of transparency. In other words, the cover of the adhesive tape has a lack of transparency. It is opaque, cloudy, or dark, in particular black.

By means of the insulating glazing unit according to the invention, a significant improvement of the aesthetic appearance of the insulating glazing unit compared to the prior art can be achieved since the conductor track of the bus bar is covered by the cover and is thus less visible, in particular when viewed from the inside of a space.

The invention provides several advantages. For example, on the one hand, considerable costs can be saved by using an electrically conductive adhesive tape. In addition, by bonding the adhesive tape to the electrically conductive coating and/or to the electrically controllable functional element, it is possible to prevent a short-circuit between the electrode layers of the functional element that is produced by baking bus bars on the functional element.

The electrically conductive adhesive tape is connected, via the electrically conductive adhesion layer, to the electrically conductive coating and/or to the electrically controllable functional element. The electrically conductive adhesion layer contains at least one electrically conductive material, preferably metallic material, for example, silver, gold, or aluminum. It is also possible for the electrically conductive adhesion layer to contain a non-metallic electrically conductive material, for example, graphite or carbon. The at least one electrically conductive material can be introduced into an electrically non-conductive adhesive matrix, for example, epoxy resin. The at least one electrically conductive material is contained in the adhesive layer in such an amount that a desired current-carrying capacity is achieved. Preferably, the at least one electrically conductive material is contained in the adhesion layer with a mass fraction of at least 70%.

The conductor track of the adhesive tape is an electrical conductor, the width of which is significantly greater than its thickness. The conductor track is preferably designed thin enough (i.e., the thickness is small enough) that it is flexible and bendable. In an advantageous embodiment of the adhesive tape, the conductor track comprises a metal foil in the form of a strip or a tape. For example, the conductor track contains copper, aluminum, tin, gold, or silver. The conductor track can also contain or be made of alloys with the metals mentioned.

In an advantageous embodiment of the adhesive tape according to the invention, the opaque, electrically insulating cover contains polyethylene terephthalate (PET). The electrically conductive adhesive tape has a thickness of 50 µm to 1 mm, preferably 110 µm. For example, the adhesive tape can be 80 µm to 120 µm thick, with the adhesion layer having a thickness of 25 µm and the conductor track having a thickness of 35 µm. This provides the advantage that the adhesive tape is bendable.

In another advantageous embodiment, the electrically conductive adhesive tape has a width of 1 mm to 10 mm, preferably 2 mm to 4 mm. Such widths are particularly suitable, in conjunction with the aforementioned thicknesses, for achieving sufficient current-carrying capacity. It goes without saying that the length, width, and thickness of the adhesive tape can be adapted to the requirements of the respective individual case.

In another advantageous embodiment, the opaque, electrically insulating cover almost completely covers the conductor track of the electrically conductive adhesive tape. This provides the advantage that the conductor track is better protected against corrosion and contamination.

Furthermore, a first bus bar can extend along a first side edge of the electrically conductive coating and/or the electrically controllable functional element; and a second bus bar, along a second side edge of the electrically conductive coating and/or the electrically controllable functional element. In a particularly preferred embodiment, the two bus bars are arranged on opposite sides of the insulating glazing unit in the glazing interior space. The bus bars are preferably arranged such that they are arranged horizontally in the installed state of the insulating glazing unit. However, it is also possible for them to be arranged vertically in the installed state.

In another embodiment, a bus bar can even be routed around the corner, i.e., the bus bar is situated on two sides of the insulating glazing unit that are connected to one another. In this case, the bus bar can even be implemented discontinuously, in particular in the case of large insulating glazing units, and can be formed in two parts. The bus bar then has two legs arranged angled relative to one another, at an angle, in particular an angle less than 180°, preferably of approx. 90°. At one corner of the insulating glazing unit, the legs can, for example, be electrically conductively connected to one another via an electrically conductive bridge element. For this, the bridge element has an electrically conductive material, for example, copper.

As an alternative to the connection via the bridge element, a first leg can at least partially overlap a second leg, with the first leg and the second leg being arranged at an angle relative to one another.

According to another advantageous embodiment, the second leg has a connection region for electrically contacting the first leg with the second leg. The opaque, electrically insulating cover of the second leg has, for this purpose, a cutout in the connection region. The cutout forms a material-free passage all the way to the conductor track of the second leg. The cutout is, for example, a rectangular, circular, or oval opening in the opaque, electrically insulating cover, wherein it goes without saying that, in principle, any shapes are possible. The cutout has a volume such that the first leg of the bus bar can be reliably and securely adhered by the electrically conductive adhesion layer to the conductor track of the second leg. The connection region is is advantageously implemented flat and preferably consists of a non-insulated region of the second leg. Such flat connection regions are particularly suitable for contacting electrically conductive adhesive tapes, since they have a large surface area that can be brought into contact with the electrically conductive adhesion layer of the adhesive tape and thus form a low impedance electrical line connection.

In another embodiment, the second leg has a first section, a second section, and a fold, with the first section and the second section of the second leg arranged at least partially one above the other. Wherein the first section runs perpendicular to the second section and the adhesion layer of the second section faces the glazing interior space. The second section has a region in which the first bus bar and the second bus bar overlap such that an electrically conductive connection between the first and the second leg of the bus bar is produced. The second section has a contact region that is provided for electrically contacting the first leg such that an electrically conductive connection between the first leg and the second leg is produced.

The insulating glazing unit comprises at least two panes that are held apart from one another by at least one spacer. Another name for an insulating glazing unit is "multiple pane insulating glazing". The insulating glazing unit can, for example, be a double-pane insulating glazing comprising two panes, a triple-pane insulating glazing comprising three panes, or a quadruple-pane insulating glazing comprising four panes. The insulating glazing unit preferably comprises two or three panes.

Of the at least two panes of the insulating glazing unit, two panes are outer panes that are in contact with the outside environment. One side of one outer pane, the inner side or the inside, faces a glazing interior space; and the other side, the outer side or the outside, faces the outside environment. In a preferred embodiment, an outer pane is a composite glass of at least two individual glasses, in particular the outer pane, which faces outward in the installed state. If the insulating glazing unit comprises more than two panes, one or more panes, the inner panes, are arranged between the two outer panes. One side of an inner pane faces a glazing interior space and the other side faces another glazing interior space.

The insulating glazing unit according to the invention comprises at least one spacer, preferably one or two spacers. The spacer has two pane contact surfaces extending parallel to one another. Spacers known from the prior art can be used as spacers.

Spacers that distance two panes from one another are common. These can generally be used for multi-pane insulating glasses, such as double-pane insulating glasses, triple-pane insulating glasses, and quadruple-pane insulating glasses. Accordingly, for triple-pane and quadruple-pane insulating glasses, two or three such spacers are required: a first spacer to distance an outer pane from the inner pane and a second spacer to distance the other outer pane from the inner pane. Spacers that can distance three panes from another are also known.

In a preferred embodiment, the spacer has a glazing interior surface that is connected to the two pane contact surfaces, and an outer surface that is connected directly or via connecting surfaces to the two pane contact surfaces. The glazing interior surface faces the glazing interior space, whereas the outer surface, often also referred to as the bonding surface, faces the glazing exterior space.

In a preferred embodiment, the outer surface is connected to the two pane contact surfaces via connecting surfaces, i.e., to a pane contact surface via a connecting surface and/or to the other pane contact surface via another connecting surface, wherein, preferably, both pane contact surfaces are connected to the outer surface via such connecting surfaces. The connecting surface can, for example, be at an angle in the range from 30° to 60° relative to the outer surface. The two pane contact surfaces are usually approx. perpendicular or perpendicular to the plane in which the outer surface is situated, and/or to the plane, in which the glazing interior surface is situated. Generally, the outer surface and the glazing interior surface run parallel to one another. The glazing interior surface is generally connected directly to the two pane contact surfaces. However, the glazing interior surface can optionally also be connected to the pane contact surfaces via connecting surfaces.

The spacer can optionally have, in the interior, one or a plurality of cavities, preferably a central cavity. Desiccant is generally contained in the cavity or cavities. The glazing interior surface preferably has openings to facilitate the absorption of atmospheric moisture by desiccant optionally present in the spacer.

It goes without saying that the dimensions of the spacer depend on the dimensions of the insulating glazing unit. The width of the spacer can, for example, be in the range from 4 to 30 mm, preferably 8 to 16 mm. The height of the spacer can, for example, be in the range from to 15 mm, preferably 5 to 10 mm. The width of a spacer refers to the direction of one side contact surface to the other side contact surface. The height refers to the direction from the outer surface to the glazing interior surface.

In the case of a triple-pane insulating glazing, in an alternative embodiment, a spacer suitable for distancing three panes can be used. Such a spacer corresponds to a spacer as described above except that a receiving device for a pane is additionally provided in the glazing interior surface. The receiving device for a pane can, for example, be designed in the form of a groove. If this type of spacer has one or more desiccant-containing cavities, there are preferably two cavities, with one cavity situated on one side of the receiving device and the other cavity situated on the opposite side of the receiving device. As stated, for triple-pane insulating glazings, two individual spacers can also be used for distancing two panes in each case.

It goes without saying that the dimensions of the spacer suitable for spacing three panes also depend on the dimensions of the insulating glazing unit. The width of such a spacer can, for example, be in the range from 10 to 50 mm, preferably 20 to 36 mm. The height can, for example, be in the range from 5 to 15 mm, preferably 5 to 10 mm.

The spacer that is used in the insulating glazing unit is formed, for example, from metal or plastic, plastic being preferred. Examples of suitable metals include stainless-steel and aluminum. As plastic, materials with relatively low thermal conductivity, so-called "warm-edge" systems are preferred. Plastic spacers are also referred to as polymeric spacers.

Spacers that are made of plastic can contain, for example, one or more polymers selected from polyethylene (PE), polycarbonate (PC), polypropylene (PP), polystyrene, polybutadiene, polynitrile, polyesters, polyurethanes, polymethyl methacrylate, polyacrylate, polyamide, polyethylene terephthalate (PET), silicone, polybutylene terephthalate (PBT), acrylonitrile butadiene styrene (ABS), acrylonitrile styrene acrylester (ASA), acrylonitrile butadiene styrene-polycarbonate (ABS/PC), styrene-acrylonitrile (SAN), PET/PC, PBT/PC, and/or copolymers thereof, with ABS, ASA, ABS/PC, SAN, PET/PC, PBT/PC, and/or copolymers thereof being preferred.

The spacer, in particular those made of plastic, can optionally contain one or more additives that are customary for such materials, e.g., desiccants, colorants, e.g., pigments or dyes, reinforcing materials, fillers, light protection means, stabilizers, release agents, and the like. Desiccants can be contained in cavities or cutouts of the spacer or in the plastic matrix of the spacer. Other additives are usually contained in the plastic matrix of the spacer. Examples of suitable desiccants include silica gels, molecular sieves, $CaCl_2$), $Na_2SO_4$, activated carbon, silicates, bentonites, zeolites, and/or mixtures thereof.

The spacer can be transparent; however, in a preferred embodiment, it is non-transparent, i.e., opaque. Common colors for the spacer are, for example, black, white, brown, or gray, in particular when the spacer is made of plastic. In the case of a spacer made of metal, the color is usually determined by the material used.

The panes of the insulating glazing unit can be made of organic glass or, preferably, inorganic glass. In an advantageous embodiment of the insulating glazing unit according to the invention, the panes can, independently of one another, be made of flat glass, float glass, soda lime glass, quartz glass, or borosilicate glass. The thickness of each pane can vary and thus be adapted to the requirements of the individual case. Preferably, panes with standard thicknesses of 1 mm to 19 mm and preferably of 2 mm to 8 mm are used. The panes can be colorless or colored. At least one pane can be designed as patterned glass.

The panes of the insulating glazing unit are, in particular, insulating glass panes, composite panes, or single glass panes. A composite pane can comprise at least two panes that are joined to one another via an intermediate layer. The intermediate layer can preferably be a thermoplastic such as polyvinyl butyral (PVB), ethylene vinylacetate (EVA), polyurethane (PU), or multiple layers thereof, preferably with thicknesses of 0.3 mm to 0.9 mm.

The insulating glazing unit preferably comprises at least one pane, more preferably at least two panes, which is/are, independently of one another, a float glass pane, a composite pane, patterned glass, or a colored or satinized glass. More preferably, at least one pane is a float glass pane.

The insulating glazing unit comprises at least one pane, that is, on the side facing the/a glazing interior space, at least partially provided with an electrically conductive coating and/or an electrically conductive functional element. The electrically conductive coating can, optionally, be an electrically switchable coating. The electrically conductive functional element can, optionally, be an electrically switchable functional element.

The electrically conductive coating or the electrically conductive functional element is generally provided on an interior side of one of the two outer panes or, if present, on one of the sides of an inner pane, with the electrically conductive coating or the electrically conductive functional element preferably applied on an interior side of an outer pane. In a preferred embodiment, the outer pane on the inner side of which the electrically conductive coating or the electrically conductive functional element is attached is the outer pane that faces outward in the installed state, with the outer pane preferably being a composite glass composed of at least two individual glasses.

Such an electrically conductive coating or such an electrically conductive functional element can, for example, function as lighting, heating, or antenna or be used in an electrically switchable glazing such as displays or electrochromic glazing. Such a coating or such a functional element can, for example, also be suitable for alarm glass for a burglar alarm or glass for protection against electromagnetic radiation.

The electrically conductive coating or the electrically conductive functional element is preferably an electrochromic coating, a transparent, electrically conductive coating, or one or a plurality of photovoltaic elements such as solar cells for electric power generation, wherein an electrochromic coating is particularly preferred.

The electrochromic coating preferably includes at least two electrode layers and two electrochemically active layers situated between the two electrode layers, which are separated from one another by an electrolyte layer. The two active layers are in each case capable of reversibly storing small ions, with at least one of the two layers made of an electrochromic material that has different oxidation states that correspond to the stored or released state of the ions and have a different coloration. Through application of electrical voltages of different polarity, the storing or releasing of the ions can be controlled in order to selectively influence the optical transmittance of the coating.

The transparent, electrically conductive coating can be transparent to electromagnetic radiation, preferably electromagnetic radiation of a wavelength from 300 to 1300 nm, in particular for visible light from 390 nm to 780 nm. "Transparent" means that the total transmittance of the pane is, in particular for visible light, preferably >70% and in particular is >75% transparent.

The transparent, electrically conductive coating is preferably a functional coating, more preferably a coating with solar protection. A coating with solar protection has reflecting properties in the infrared range. The transparent, electrically conductive coating can have particularly low emissivities (low-E). As a result, heating of the interior of a building due to sunlight is advantageously reduced. Panes provided with such a transparent, electrically conductive coating are commercially available and are referred to as low-E glass (low emissivity glass).

Such coatings typically include at least one metal, in particular silver or a silver-containing alloy. The transparent, electrically conductive coating can include a sequence of multiple individual layers, in particular at least one metallic layer and dielectric layers that contain, for example, at least one metal oxide. The metal oxide preferably contains zinc oxide, tin oxide, indium oxide, titanium oxide, silicon oxide, aluminum oxide, or the like, as well as combinations of one or more thereof. The dielectric material can also contain silicon nitride, silicon carbide, or aluminum nitride.

Particularly suitable transparent, electrically conductive coatings contain at least one metal, preferably silver, nickel, chromium, niobium, tin, titanium, copper, palladium, zinc, gold, cadmium, aluminum, silicon, tungsten, or alloys thereof, and/or at least one metal oxide layer, preferably tin-doped indium oxide (ITO), aluminum-doped zinc oxide (AZO), fluorine-doped tin oxide (FTO, $SnO_2$:F), antimony-doped tin oxide (ATO, $SnO_2$:Sb), and/or carbon nanotubes and/or optically transparent, electrically conductive polymers, preferably poly(3,4-ethylene dioxythiophenes), poly-styrene sulfonate, poly(4,4-dioctyl-cylopentadithiophene), 2,3-dichloro-5,6-dicyano-1,4-benzoquinone, mixtures, and/or copolymers thereof.

The transparent, electrically conductive coating preferably has a layer thickness of 10 nm to 5 μm and particularly preferably of 30 nm to 1 μm. The sheet resistance of the transparent, electrically conductive coating is, for example, 0.35 ohm/square to 200 ohm/square, preferably 0.6 ohm/square to 30 ohm/square, and in particular 2 ohm/square to 20 ohm/square.

The insulating glazing unit includes at least two bus bars, which are arranged on the electrically conductive coating and/or on the electrically conductive functional element and are in electrical contact therewith.

The electrically conductive coating, in particular the electrochromic coating, or the electrically conductive functional element are thus electrically connected to the at least two bus bars. Generally, two bus bars are provided on the electrically conductive coating or on the electrically conductive functional element.

In the insulating glazing unit according to the invention, one pane contact surface of a spacer is connected to one pane via a sealant, and the other pane contact surface of the spacer is connected to another pane via a sealant. In this way, at least one glazing interior space and at least one glazing exterior space are formed.

The glazing interior space is delimited by the two panes, the spacer, and the sealant placed between the pane and the pane contact surface and constitutes a sealed cavity. The glazing interior space can be filled with air or another gas, in particular a noble gas, such as argon or krypton. When a spacer is used to distance three panes from one another, as described above, two glazing interior spaces are formed, one between an outer pane and the inner pane and one between the other outer pane and the inner pane. The glazing interior surface of the spacer faces the glazing interior space.

The glazing exterior space is likewise formed by the two panes, the spacer, and the sealant placed between the pane and the pane contact surface and is situated opposite the glazing interior space in the outer edge region of the insulating glazing unit. The glazing exterior space is open on the side opposite the spacer. The outer surface of the spacer faces the glazing exterior space.

The panes, the sealant placed between the pane and the pane contact surface, and the spacer delimit the glazing interior space from the glazing exterior space and do not belong to either the glazing interior space or to the glazing exterior space.

The sealant for joining the side contact surface of the spacer and the pane serves, on the one hand, to bond the spacer to the pane and, on the other, to seal the gap between the spacer and the pane. Suitable sealants are based, for example, on butyl rubber, polyisobutylene (PIB), polyethylene vinyl alcohol, ethylene vinyl acetate, polyolefin rubber, copolymers, and/or mixtures thereof.

The electrically conductive coating and/or the electrically conductive functional element can be arranged over the entire surface or on part of the surface of the pane in the region of the glazing interior space.

Depending on the position of the electrically conductive coating or the electrically conductive functional element, the at least two bus bars are generally connected to an inner side of one of the two outer panes or, if present, to one of the sides of an inner pane, with the bus bars preferably connected to an inner side of an outer pane. In the installed state of the insulating glazing unit, this can be the outer pane facing the interior or the outer pane facing away from the interior.

Furthermore, the insulating glazing unit generally has one or a plurality, preferably at least one or two, electrical connection elements for connecting to a power supply and one or a plurality, preferably at least one or two, electrical contact elements for the electrical connection of the bus bars to the electrical connection elements.

The connection elements can, for example, be a cable and/or a flexible printed circuit board with at least one electrical component. The cable can, for example, be a flat cable or a round cable. The cable can have one or a plurality of conductors. Flexible printed circuit boards usually have a flexible plastic carrier that is printed with an electronic circuit.

The electrical contact element for the electrical connection of the bus bars to the electrical connection element is, e.g., a spring contact, or contacting is preferably done by soldering; adhesive contacts are also conceivable. Suitable contact elements are familiar to the person skilled in the art, for example, also in the form of plug contacts or crimp connections.

In the insulating glazing unit according to the invention, an outer seal is generally introduced as usual into the at least one glazing exterior space. The outer seal can be directly adjacent the outer surface of the spacer or can be connected thereto via a sealant. Suitable interposed sealants are, for example, the sealants described above. The outer seal usually fills the glazing exterior space in its entire width between the panes.

The outer seal preferably contains a polymer or a silane-modified polymer, particularly preferably organic polysulfides, silicones, silicone rubber that can be room-temperature vulcanized, high temperature vulcanized, peroxide vulcanized, and/or addition vulcanized, polyurethanes, and/or butyl rubber. Such materials have very good adhesion to glass such that the outer seal serves above all for bonding of the panes and contributes to the mechanical stability of the insulating glazing unit. In an optional embodiment, additives to increase aging resistance, for example, UV stabilizers, can also be included.

The insulating glazing unit can include an opaque coating applied in the edge region of a pane, preferably on an outer side of the first pane. The opaque coating serves as a flat privacy element applied in the edge region of a pane. The opaque coating can also be formed circumferentially on the edge region of the pane.

The insulating glazing according to the invention is suitable in particular as building interior glazing, building exterior glazing, or façade glazing. The invention therefore relates also to the use of the insulating glazing unit according to the invention as building interior glazing, building exterior glazing, or façade glazing.

In the following, the invention is explained in detail with reference to figures and exemplary embodiments. The figures are a schematic representation and are not to scale. The figures in no way restrict the invention.

Figure 2:
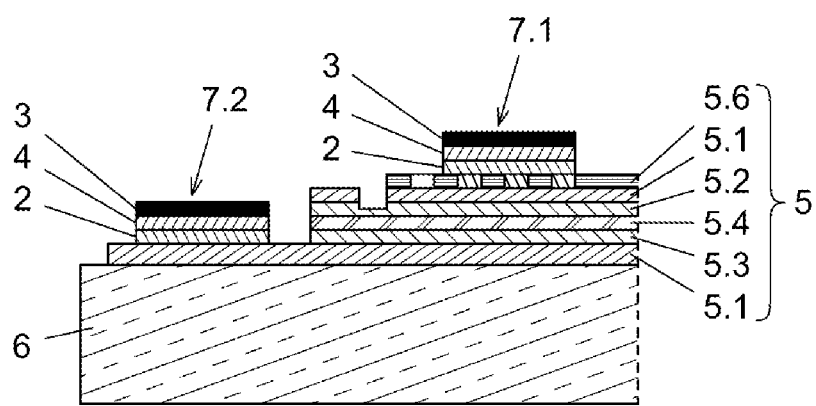
Figure 3:
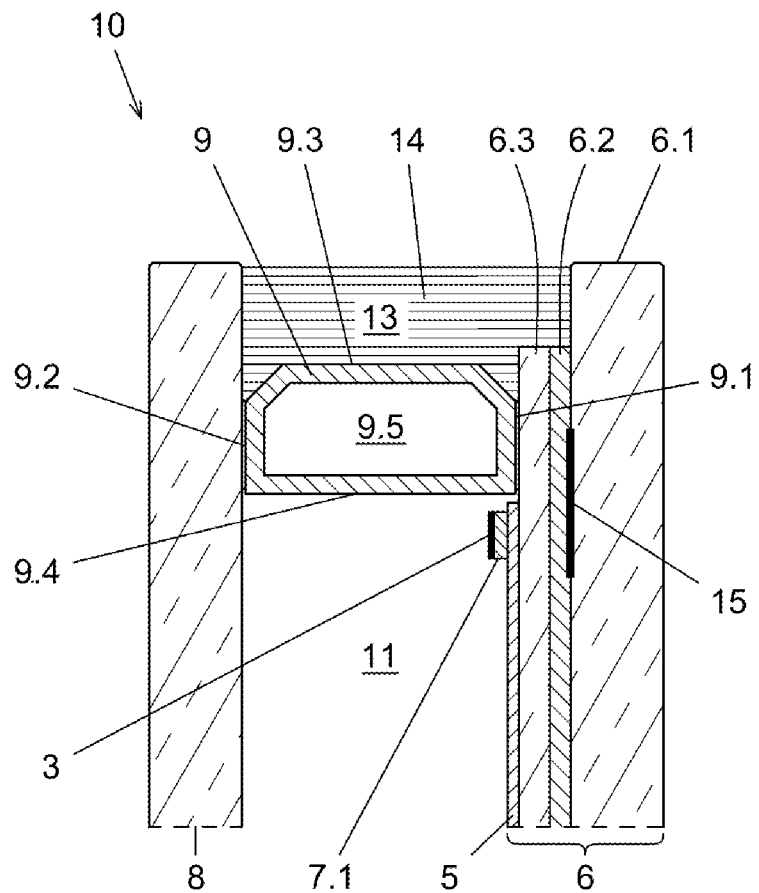
Figure 4:
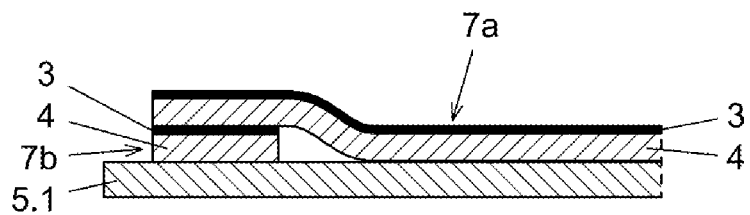
Figure 5:
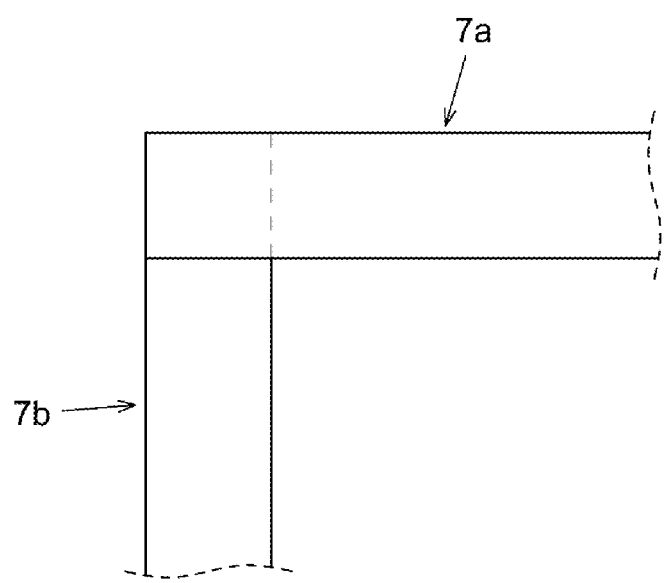
Figure 6:
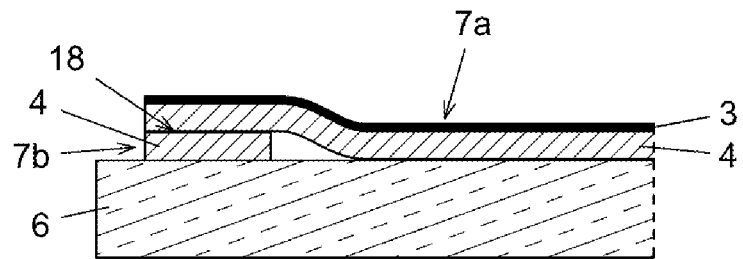
Figure 7:
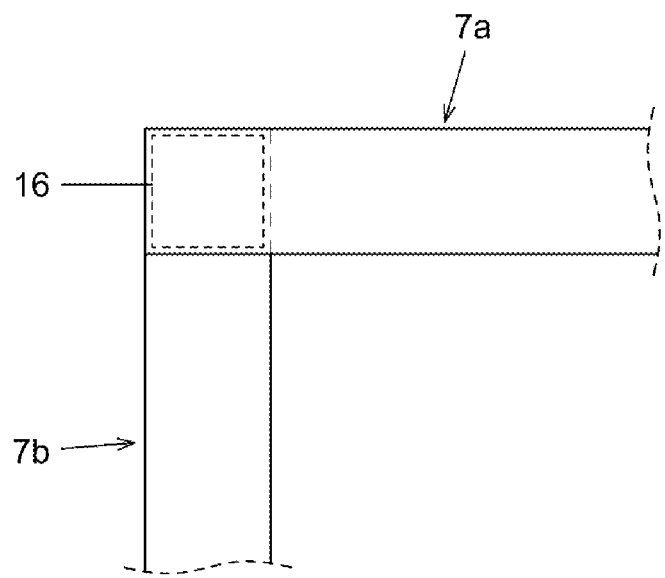
Figure 8:
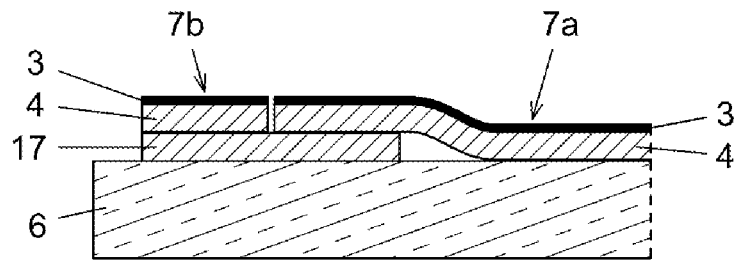
Figure 9:
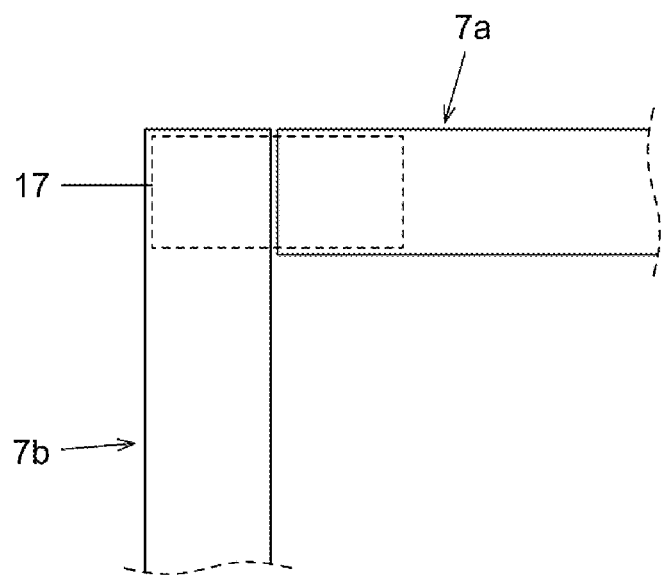
Figure 10:
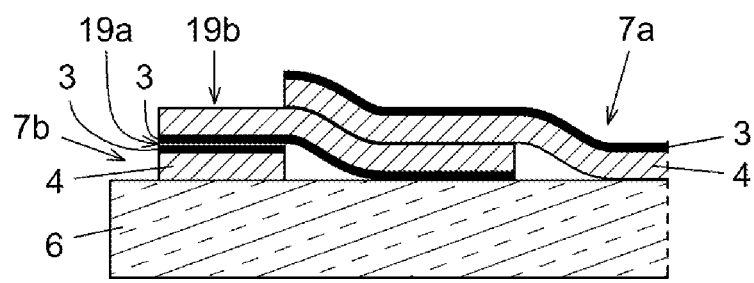
Figure 11:
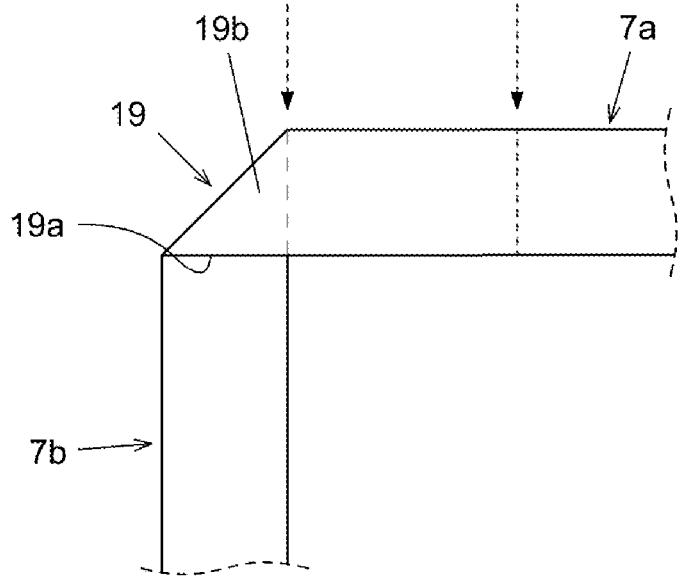
Figure 12:
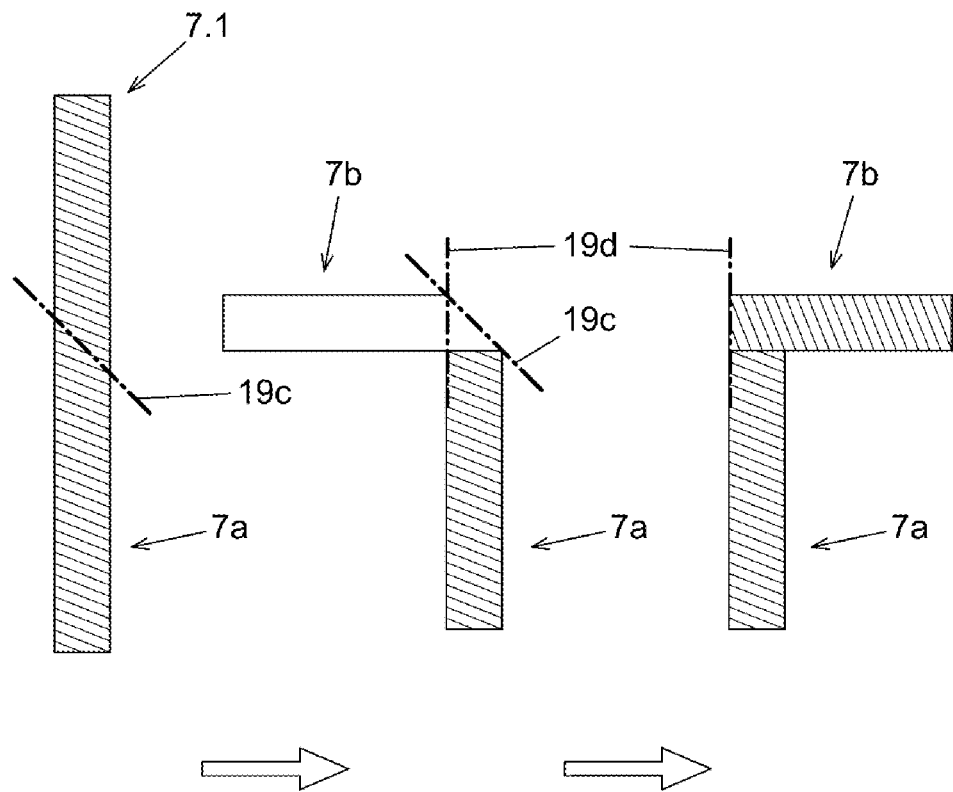
Figure 13:
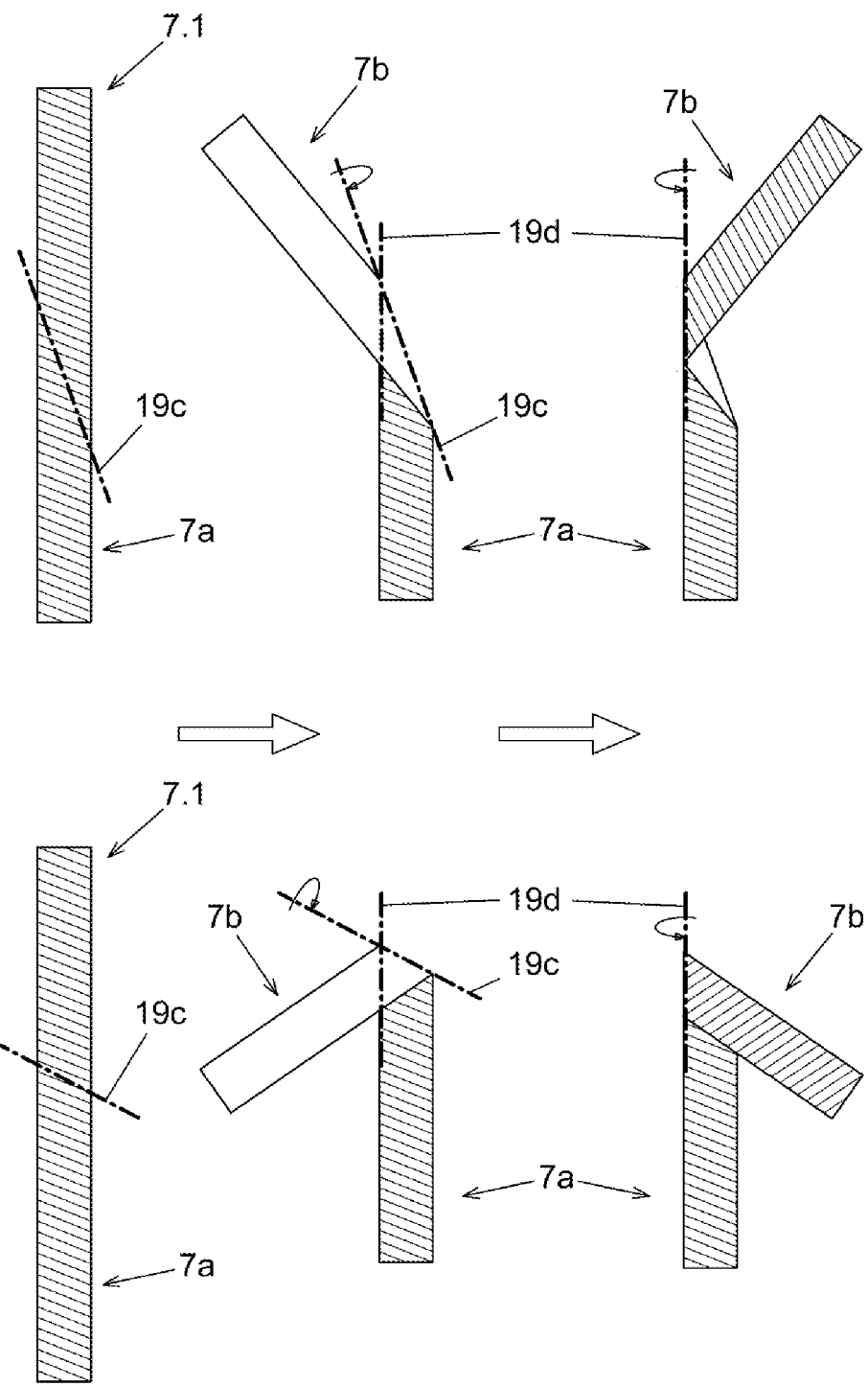
Figure 14:
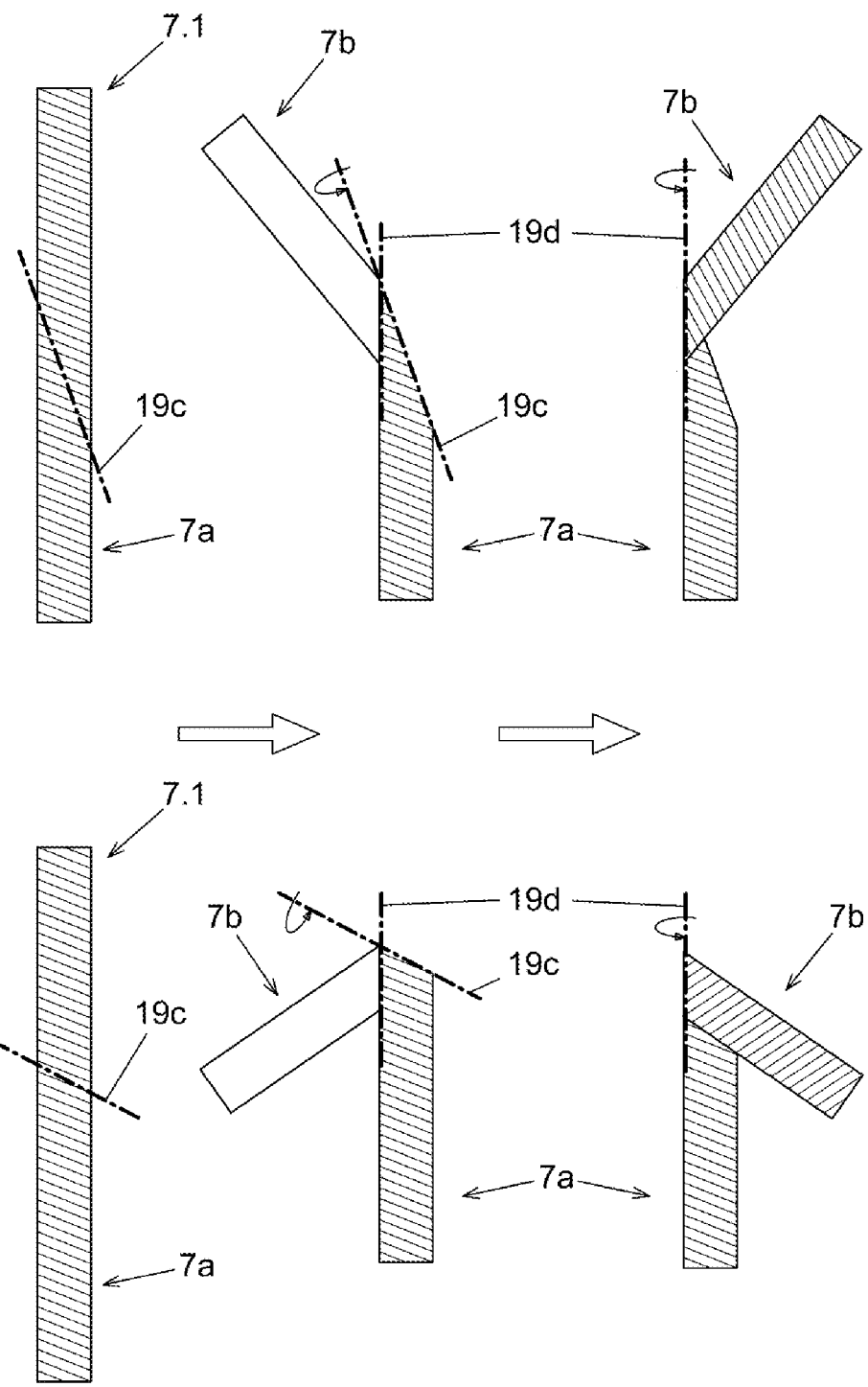

They depict:

FIG. 1 a schematic cross-section of an electrically conductive adhesive tape with a cover, FIG. 2 a schematic cross-section of an electrically controllable functional element, FIG. 3 a detail of an insulating glazing unit according to the invention in cross-section, FIG. 4 a schematic cross-section of a first inventive embodiment of a corner connection of a bus bar, FIG. 5 a plan view of the corner arrangement of FIG. 4, FIG. 6 a schematic cross-section of a second inventive embodiment of a corner connection, FIG. 7 a plan view of the corner arrangement of FIG. 6, FIG. 8 a schematic cross-section of a third inventive embodiment of a corner connection, FIG. 9 a plan view of the corner arrangement of FIG. 8, FIG. 10 a schematic cross-section of a fourth inventive embodiment of a corner connection, FIG. 11 a plan view of the corner arrangement of FIG. 10, FIG. 12 a plan view of a fifth inventive embodiment of a corner connection, FIG. 13 a plan view of the fifth embodiment of a corner connection with different angles, and FIG. 14 a plan view of further embodiments of a corner connection.

Specifications with numerical values are generally not to be understood as exact values, but also include a tolerance of ±1% up to ±10%.

FIG. 1 depicts a schematic cross-section of the electrically conductive adhesive tape 1. The electrically conductive adhesive tape 1 has an electrically conductive adhesion layer 2. A conductor track 4 is situated between the electrically conductive adhesion layer and a cover 3. The cover 3 has a thickness of approx. 50 μm. The conductor track 4 comprises a strip-shaped layer of copper. The conductor track 4 has a thickness of approx. 35 μm. The electrically conductive adhesion layer 2 serves to adhere the conductor track 4 to a pane and includes a large amount of an electrically conductive material. The electrically conductive adhesion layer 2 has a thickness of approx. 25 μm. The electrically conductive adhesive tape 1 is flexible.

FIG. 2 depicts a schematic cross-section of an electrically controllable functional element 5. The functional element 5 is an electrochromic functional element that is arranged on an interior-side surface of a first pane 6. The pane 6 can alternatively be provided with an electrically conductive coating.

The functional element 5 extends almost completely over the interior-side surface of the first pane 6, minus an edge region from the edge of the pane 6.

The functional element 5 is electrically contacted by a first bus bar 7.1 formed from the adhesive tape 1 and by a second bus bar 7.2 formed from the adhesive tape 1. The first bus bar 7.1 is applied on a first electrode layer 5.1, and the second bus bar 7.2 is applied on a second electrode layer 5.1 of the functional element 5.

The electrochromic functional element 5 comprises the two electrode layers 5.1 and two electrochemically active layers 5.2, 5.3, situated between the two electrode layers 5.1 and separated from one another by an electrolyte layer 5.4. The two active layers are in each case capable of reversibly storing ions, with at least one of the two layers 5.2, 5.3 being made of an electrochromic material that has different oxidation states corresponding to the stored or released state of the ions and having different coloration. The storage or release of the ions can be controlled by applying an electrical voltage to the two bus bars 7.1, 7.2, thus selectively controlling the optical transmittance of the functional element 5.

In addition, an electrically insulating antireflection layer 5.6 can be arranged on the upper electrode layer 5.1. The antireflection layer comprises a dielectric material with a refractive index of 1.4 to 1.6. For this purpose, the antireflection layer 5.6 has multiple cutouts in the region of the bus bar 7.1 such that the electrode layer 5.1 can be or is electrically connected to the bus bar 7.1 via the electrically conductive adhesion layer 2. The thickness of the antireflection layer is preferably 20 nm to 100 nm. The width of the cutouts is sufficient to ensure electrical contact between the surface electrode 5.1 and the bus bar 7.1. Such antireflection layers are described by way of example in WO 2019/055306 A1, to which reference is made for the antireflection layer and the cutouts.

FIG. 3 depicts a detail of an insulating glazing unit 10 in cross-section. The insulating glazing unit 10 comprises the first pane 6 and a second pane 8, connected via a spacer 9. The spacer 9 is mounted between the first pane 6 and the second pane 8 arranged parallel thereto. The spacer 9 has a first pane contact surface 9.1, a second pane contact surface 9.2 that extends parallel to the first pane contact surface 9.1, an outer surface 9.3, and a glazing interior surface 9.4. The outer surface 9.3 is connected to the two pane contact surfaces 9.1, 9.2 via a connecting surface. The spacer 9 has a cavity 9.5 in which desiccants can be contained.

A glazing interior space 11 (not shown entirely) is defined by the first pane 6, the second pane 8, and the glazing interior surface 9.4 of the spacer 9. The first pane 6 is connected to the first pane contact surfaces 9.1 via a sealant, and the second pane 8 is is connected to the second pane contact surface 9.2 via a sealant. A glazing exterior space 13 is delimited by the first pane 6, the second pane 8, and the outer surface 9.3 of the spacer 9 and is filled with an outer seal 14.

The first pane 6 has the electrochromic functional element 5 on the interior-side surface. The functional element 5 extends over almost the entire surface of the interior-side surface of the first pane 6, minus an edge region from the edge of the pane. The functional element 5 is contacted by the first bus bar 7.1, which is situated in the glazing interior space 11. The insulating glazing unit 10 has electrical connection elements (not shown in FIG. 3), e.g., ribbon cables or cables that can be connected to an external voltage source (not shown in FIG. 3). The first bus bar 7.1 and a connection element are electrically conductively connected to one another via a contact element. The electrical contact between the first electrode layer 5.1 and the first bus bar 7.1 is established by the electrically conductive adhesion layer 2. The contact element can be implemented as a flexible, T-shaped cable. The T-shaped cable can have two metallic contacting surfaces on its two side arms, which are provided for contacting with the conductor track 4 of the bus bar 7.1. The electrical contact between the contact element and the conductor track 4 can be established by soldering or gluing with an electrically conductive adhesive.

The first pane 6 is a float glass in the form of a laminated safety glass VSG. The laminated safety glass has two individual panes (6.1 and 6.3) that are joined together via an intermediate layer 6.2. Preferably, it is a VSG composed of a 4-mm-thick (or 5-mm-thick) pane 6.1, bonded to a 2.2-mm-thick EC pane 6.3 (electrochromic glass). The 4-mm-thick pane 6.1 is a float glass.

The thick pane 6.1 is provided on the interior side with an opaque coating 15, which is a black screen print. The opaque coating 15 is applied in the form of a strip and is situated approx. in a region at the height from the lower end of the pane to the upper end of the first bus bar 7.1. The opaque coating 15 can be approx. 15 mm to 30 mm wide (from the edge of the glass). The opaque coating 15 restricts the through-vision region of the insulating glazing unit 10 and completely obscures the bus bar 7.1 when viewed from the outside within a certain viewing angle range.

The spacer is formed from styrene-acrylonitrile (SAN), which is opaque. The distance from the plane of the glazing interior surface 9.4 to the upper end of the bus bar 7.1 is approx. 9 mm. Butyl was used as the sealant and silicone was used as the outer seal 14. The spacer has, for example, a height of approx. 6 mm and a width of approx. 15 mm. The dimensioning must, of course, be adapted to the respective requirements, for example, the width must be adapted to the requirements for good thermal insulation.

FIG. 4 depicts a schematic cross-section of a first inventive embodiment of a bus bar 7.1 at a corner arrangement of the insulating glazing unit 10. The bus bar 7.1 is formed from the adhesive tape 1. Since the adhesive tape 1 is flexible, the bus bar 7.1 can advantageously be guided around the corner. The bus bar 7.1 comprises a first leg 7a and a second leg 7b. FIG. 4 shows a right-angled electrically conductive connection of the two legs 7a, 7b. The two legs 7a, 7b have, in each case, a conductor track 4 that is electrically conductively connected to the electrode layer 5.1 via an adhesion layer 2. Thus, an electrically conductive connection is created from the first leg 7a to the second leg 7b via the electrode layer 5. In each case, the cover 3 completely covers the conductor track 4 of the two legs 7a and 7b.

FIG. 5 shows a plan view of the corner arrangement in accordance with FIG. 4. The legs 7a and 7b are arranged at right angles to each other to create a right-angled corner connection.

FIG. 6 depicts a schematic cross-section of a second inventive embodiment of a bus bar 7.1 at a corner arrangement. In contrast to FIG. 4, the bus bar 7.1 of FIG. 6 is not arranged on a conductive electrode layer, but, instead, directly on the first pane 6. Analogously to FIG. 4, the bus bar 7.1 comprises the conductor track 4, the adhesion layer 2, and the cover 3. The second leg 7b has a connection region 18. The connection region 18 serves to electrically contact the first leg 7a with the second leg 7b. In the connection region 18, the legs 7a and 7b overlap such that the conductor track 4 of the leg 7a is electrically conductively connected to the conductor track 4 of the leg 7b.

FIG. 7 shows a plan view of the corner arrangement of FIG. 6. In contrast to FIG. 5, the cover 3 of the second leg 7b has a cutout 16. The cutout 16 forms the connection region 18.

FIG. 8 depicts a schematic cross-section of a third inventive embodiment of the bus bar 7.1 at a corner arrangement. In contrast to FIG. 6, the two legs 7a and 7b of the bus bar 7.1 are electrically conductively connected to one another via a bridge element 17. The bridge element 17 comprises a conductor track 4 and an adhesion layer 2. The adhesion layer 2 is applied on a surface of the bridge element 17 that faces the first pane 6. The first leg 7a and the second leg 7b are arranged on a surface of the bridge element 17 facing away from the first pane 6. The first leg 7a and the second leg 7b are adhesively and electrically conductively connected to the bridge element 17 via the adhesion layer 2.

FIG. 9 shows a plan view of the corner arrangement of FIG. 8. The first leg 7a and the second leg 7b form a right-angle.

FIG. 10 depicts a schematic cross-section of a fourth inventive embodiment of the bus bar 7.1 at a corner arrangement. The second leg 7a has a first section 19a, a second section 19b, and a fold 19. During folding, the first section 19a and the second section 19b of the second leg 7b are arranged partially one above the other. The first section 19a runs perpendicular to the second section 19b. In the region of the fold 19, the adhesion layer 2 of the second section 19b faces the glazing interior space 11. The second section 19b has a region in which the first leg 7a and the second leg 7b overlap such that an electrically conductive connection between the conductor track 4 of the first leg 7a and the conductor track 4 of the second leg 7b is created.

FIG. 11 shows a plan view of the corner arrangement of FIG. 10. The first leg 7a and the second leg 7b are arranged at right angles to one another.

FIG. 12 depicts a plan view of a fifth inventive embodiment of the bus bar 7.1 at a corner arrangement. The bus bar 7.1 is formed in one piece and comprises a first leg 7a and a second leg 7b. The bus bar 7.1 has a first fold along the auxiliary line 19c and a second fold along the auxiliary lines 19d, in which in the first, triangular section of the first leg 7a and in the second, triangular section of the second leg 7b, the legs 7a and 7b adhere to one another via the adhesion layers 2. Here, the leg 7b runs perpendicular to the leg 7a, whereby, outside the first section 19d and outside the second section 19e, the adhesion layer 2 of the bus bar 7.1 faces the functional element 5.

FIG. 13 shows, analogously to FIG. 12, the fifth embodiment of the bus bar 7.1 at a corner arrangement. As illustrated in FIG. 13, the legs 7a and 7b can alternatively be arranged at different angles relative to one another. The angle between the legs 7a and 7b can be approx. 10° to 170°.

FIG. 14 depicts further possible embodiments of the folds 19 in a plan view. The bus bar 7.1 is implemented in one piece and comprises a first leg 7a and a second leg 7b. The bus bar 7.1 can have a double rotation (360° rotation) of the second leg 7b in the fold region such that the second leg 7b adheres to the surface electrode 5.1 with its adhesion layer 2. The legs 7a and 7b can form an angle of approx. 10° to 170°.

LIST OF REFERENCE CHARACTERS

1 adhesive tape
2 adhesion layer
3 cover
4 conductor track
5 functional element
5.1 electrode layer
5.2 active layer
5.3 active layer
5.4 electrolyte layer
5.6 antireflection layer
6 first pane
6.1 thick pane
6.2 intermediate layer
6.3 EC (electrochromic) pane
7.1 first bus bar
7.2 second bus bar
7a first leg of the bus bar (7.1)
7b second leg of the bus bar (7.1)
8 second pane
9 spacer
9.1 first pane contact surface
9.2 second pane contact surface
9.3 outer surface of the spacer
9.4 glazing interior surface of the spacer
9.5 cavity of the spacer
10 insulating glazing unit
11 glazing interior space
13 glazing exterior space
14 seal
15 opaque coating
16 cutout
17 bridge element
18 connection region
19 fold
19a first section
19b second section
19c, 19d auxiliary line

The invention claimed is:

1. An insulating glazing unit, comprising at least two panes and at least one spacer, which has two pane contact surfaces, which run parallel to one another,
wherein a first pane contact surface is connected to a first pane of the at least two panes via a sealant and a second pane contact surface is connected to a second pane of the at least two panes via a sealant such that a glazing interior space and a glazing exterior space are formed,
wherein at least one pane of the first and second panes is provided on a side facing the glazing interior space at least partially with an electrically conductive coating and/or an electrically controllable functional element and two bus bars are provided for electrically contacting the electrically conductive coating and/or the electrically controllable functional element,
wherein a bus bar of the two bus bars comprises an electrically conductive adhesive tape,
wherein the electrically conductive adhesive tape comprises an electrically conductive adhesion layer, a conductor track, and an opaque, electrically insulating cover
wherein the electrically conductive adhesive tape is connected via the electrically conductive adhesion layer to the electrically conductive coating and/or to the electrically controllable functional element.

2. The insulating glazing unit according to claim 1, wherein the electrically conductive coating and/or the electrically controllable functional element is electrically contacted by a first bus bar of the two bus bars formed from the adhesive tape and a second bus bar of the two bus bars formed from the electrically conductive adhesive tape.

3. The insulating glazing unit according to claim 1, wherein the opaque, electrically insulating cover of the electrically conductive adhesive tape comprises polyethylene terephthalate.

4. The insulating glazing unit according to claim 1, wherein the opaque, electrically insulating cover almost completely covers the electrically conductive adhesive tape.

5. The insulating glazing unit according to claim 1, wherein the adhesive tape is 80 μm to 120 μm thick, wherein the electrically conductive adhesion layer is 25 μm thick and the conductor track is 35 μm thick.

6. The insulating glazing unit according to claim 1, wherein the conductor track of the electrically conductive adhesive tape comprises a metal.

7. The insulating glazing unit according to claim 1, wherein a first bus bar of the two bus bars extends along a first side edge of the electrically conductive coating and/or the electrically controllable functional element, and a second bus bar of the two bus bars extends along a second side edge of the electrically conductive coating and/or the electrically controllable functional element.

8. The insulating glazing unit according to claim 1, wherein one of the two bus bars is formed in two parts and has two legs angled relative to one another that are arranged at an angle relative to one another.

9. The insulating glazing unit according to claim 8, wherein the two legs are electrically conductively connected to one another via an electrically conductive bridge element.

10. The insulating glazing unit according to claim 8, wherein a first leg of the two legs at least partially overlaps a second leg of the two legs at a corner of the insulating glazing unit, wherein the first leg and the second leg are arranged at an angle relative to one another.

11. The insulating glazing unit according to claim 10, wherein the second leg has a connection region for electrically contacting the first leg with the second leg.

12. The insulating glazing unit according to claim 11, wherein the connection region of the second leg has a cutout in the opaque, electrically insulating cover.

13. The insulating glazing unit according to claim 7, wherein the second leg has a first section, a second section, and a fold, with the first section and the second section of the second leg arranged at least partially one above the other.

14. The insulating glazing unit according to claim 12, wherein the second section has a contact region that is provided for electrically contacting with the first leg such that an electrically conductive connection is created between the first leg and the second leg.

15. The insulating glazing unit according to claim 1, further comprising an opaque coating that is applied in an edge region of a pane.

16. The insulating glazing unit according to claim 6, wherein the metal is copper, tin, and/or silver.

17. The insulating glazing unit according to claim 8, wherein the angle is approximately 90°.

18. The insulating glazing unit according to claim 15, wherein the opaque coating is applied on an outer side of the first pane.

* * * * *